US010250097B2

(12) United States Patent
Maruyama et al.

(10) Patent No.: US 10,250,097 B2
(45) Date of Patent: Apr. 2, 2019

(54) STATIC PRESSURE SEAL-EQUIPPED MOTOR

(71) Applicant: Harmonic Drive Systems Inc., Shinagawa-ku, Tokyo (JP)

(72) Inventors: Toshiki Maruyama, Azumino (JP); Kazumasa Furuta, Azumino (JP)

(73) Assignee: Harmonic Drive Systems Inc., Shinagawa-ku, Tokyo (JP)

(*) Notice: Subject to any disclaimer, the term of this patent is extended or adjusted under 35 U.S.C. 154(b) by 0 days.

(21) Appl. No.: 15/565,333

(22) PCT Filed: Apr. 17, 2015

(86) PCT No.: PCT/JP2015/061906
§ 371 (c)(1),
(2) Date: Oct. 16, 2017

(87) PCT Pub. No.: WO2016/166899
PCT Pub. Date: Oct. 20, 2016

(65) Prior Publication Data
US 2018/0112709 A1   Apr. 26, 2018

(51) Int. Cl.
*F16C 33/72*   (2006.01)
*H02K 5/15*   (2006.01)
(Continued)

(52) U.S. Cl.
CPC .............. *H02K 5/15* (2013.01); *H01L 21/304* (2013.01); *H02K 5/10* (2013.01); *H02K 5/1732* (2013.01);
(Continued)

(58) Field of Classification Search
CPC .......... H02K 5/15; H02K 5/10; H02K 5/1732; H02K 5/22; H02K 11/215; H02K 2205/09;
(Continued)

(56) References Cited

U.S. PATENT DOCUMENTS 4,822,182 A * 4/1989 Matsushita ........... F16C 33/748
384/107
2002/0122608 A1   9/2002 Fujikawa et al.
(Continued)

FOREIGN PATENT DOCUMENTS

| JP | H-11-265868 A | 9/1999 |
|---|---|---|
| JP | 2001-200844 A | 7/2001 |

(Continued)

OTHER PUBLICATIONS

International Search Report (PCT/ISA/210) dated Jun. 23, 2015, by the Japanese Patent Office as the International Searching Authority for International Application No. PCT/JP2015/061906.
(Continued)

*Primary Examiner* — Gilbert Y Lee
(74) *Attorney, Agent, or Firm* — Buchanan Ingersoll & Rooney PC

(57) ABSTRACT

A static pressure seal-equipped motor in which front and rear gaps are sealed by first and second static pressure seal portions disposed at first and second axial end portions of a motor rotating shaft protruding toward front and rear. Sealing gas supplied to sealing gaps of the first and second static pressure seal portions is caused to diverge and flow to chemical liquid atmospheres and a motor chamber or an encoder chamber into the chemical liquid atmospheres, and also prevent entry of chemical liquid-containing gas from the chemical liquid atmospheres into the motor chamber or encoder chamber.

6 Claims, 2 Drawing Sheets

(51) Int. Cl.
*H01L 21/304* (2006.01)
*H02K 5/10* (2006.01)
*H02K 5/22* (2006.01)
*H02K 5/173* (2006.01)
*H02K 11/215* (2016.01)
*F16C 41/00* (2006.01)
*F16C 19/54* (2006.01)
*F16C 35/04* (2006.01)

(52) U.S. Cl.
CPC .............. *H02K 5/22* (2013.01); *H02K 11/215* (2016.01); *F16C 19/54* (2013.01); *F16C 35/042* (2013.01); *F16C 41/007* (2013.01); *F16C 2380/26* (2013.01); *H02K 2205/09* (2013.01)

(58) Field of Classification Search
CPC ...... H01L 21/304; F16C 19/54; F16C 35/042; F16C 41/007; F16J 15/40; F16J 15/403; F16J 15/406; F16J 15/42; F16J 15/43
See application file for complete search history.

(56) References Cited

U.S. PATENT DOCUMENTS

2015/0372567 A1* 12/2015 Kamiya .................. H02K 5/10
310/58
2017/0149303 A1* 5/2017 Urch ....................... B60L 11/16
2018/0115212 A1* 4/2018 Kamiya ................. B01D 45/14

FOREIGN PATENT DOCUMENTS

JP 2002-057135 A 2/2002
JP 4314625 B2 8/2009

OTHER PUBLICATIONS

Written Opinion (PCT/ISA/237) dated Jun. 23, 2015, by the Japanese Patent Office as the International Searching Authority for International Application No. PCT/JP2015/061906.

* cited by examiner

STATIC PRESSURE SEAL-EQUIPPED MOTOR

TECHNICAL FIELD

The present invention relates to a static pressure seal-equipped motor used, e.g., as a drive source, etc., for a wafer cleaning device, a chemical coating device, or a wafer conveying device, etc., used in a semiconductor manufacturing process.

BACKGROUND ART

The drive mechanism of the configuration disclosed in Patent Document 1 is known as a drive mechanism used for wafer cleaning, etc. In the drive mechanism disclosed therein, a rotary table is attached to the tip of a hollow motor shaft disposed vertically inside a container, the rotary table is caused to rotate, and cleaning liquid is sprayed on a wafer placed thereon from a supply nozzle disposed on the upper side. To ensure sealing on both the outer circumference side and the inner circumference side of the hollow shaft, a labyrinth seal is disposed on the outer circumference side and the inner circumference side of the hollow shaft.

Since a drive mechanism provided with such a seal part requires a prescribed shaft length to ensure sealing performance, the axial-direction length of the hollow motor shaft inevitably increases. An increase in the distance from the bearing position of the hollow motor shaft to the seal position, results in an increase in shaft vibration, etc.; therefore, the seal must be increased in size to avoid a decrease in sealing performance.

Proposed in Patent Document 2 is a rotary type motor in which a static pressure seal is used as the seal part. In this rotary type motor, a sealed space is formed on both sides of each of the two motor bearings supporting the rotating motor shaft, and the sealed spaces are sealed using static pressure seals. The static pressure seals are formed at sites on both sides of the motor case facing the outer circumferential surface of shaft end portions on both sides of the rotating motor shaft. Sealing gas is supplied from the exterior to the static pressure seals via an air supply path formed on the motor case.

Some of the sealing gas supplied to the static pressure seals is guided into the sealed space, and the internal pressure within the sealed space is higher than the internal pressure within the motor chamber formed between the motor bearings. An exhaust port is formed in the motor case, and sealing gas that passes through the motor bearings on both sides from the sealed space on both sides and flows into the motor chamber is directly exhausted to the exterior from the motor chamber via the exhaust port. This prevents abrasion powder, grease, etc., from leaking out of the interior of the rotary type motor and the motor bearings on both ends, and contaminating the surrounding environment.

PRIOR ART DOCUMENTS

Patent Documents

Patent Document 1: JP H11-265868 A
Patent Document 2: JP 4314625 B

SUMMARY OF THE INVENTION

Problems to be Solved by the Invention

By using the static pressure seal, it is possible for the seal part between the rotating parts and the fixed parts of the motor to be made compact, which is advantageous for flattening the motor. However, in the rotary type motor disclosed in Patent Document 2, a circumferential groove for the static pressure seal and an air supply path for supplying sealing gas to the circumferential groove are formed in the constituent components of the motor case. Also, sealed spaces for making the internal pressure higher than the internal pressure of the motor chamber are formed on each of the outer sides of the motor bearings on both sides by the sealing gas that leaks out from the static pressure seal. Thus, the static pressure seal and the air supply path are formed on the motor case and the sealed spaces are provided at both sides of the motor bearing, wherefore the structure increases in complexity and size, which is undesirable for reducing the size of the motor.

An exhaust port is provided on the motor case so that gas will be exhausted from inside the motor chamber to the exterior. The constituent components of the motor stator are attached to the inner circumferential part of the motor case. Ordinarily, ensuring space for providing an exhaust port is often difficult. Thus, the axial length of the motor often increases in order to provide the exhaust port, which is undesirable for reducing the size of the motor.

Furthermore, the sealing gas passes through the interior of the motor bearings on both sides where the rotating motor shaft is supported and flows into the motor chamber. This presents a risk that foreign matter such as abrasion powder generated inside the motor bearings may scatter towards and adhere to the parts inside the motor.

With the foregoing matter in view, it is an object of the present invention to provide a static pressure seal-equipped motor that can prevent foreign matter from leaking to the exterior, and can prevent corrosive gases or liquid, etc. from infiltrating from the exterior, without the mechanism being made more complex or larger.

Means of Solving the Problems

To address the abovementioned problems, the static pressure seal-equipped motor of the present invention is characterized in having:

a motor case;

an encoder cover attached to a rear end of the motor case;

a partition plate that that partitions between a motor chamber formed inside the motor case, and an encoder chamber formed inside the encoder cover;

a rotating motor shaft that penetrates and extends through a case front plate part of the motor case, the partition plate, and a cover back plate part of the encoder cover;

a first static pressure seal portion that seals off a gap between the case front plate part, and a first shaft end portion of the rotating motor shaft protruding to a front from the case front plate part;

a second static pressure seal portion that seals off a gap between the cover back plate part, and a second shaft end portion of the rotating motor shaft protruding to a rear from the cover back plate part;

a partition plate communication path formed in the partition plate for communication between the motor chamber and the encoder chamber; and an exhaust port formed in the encoder cover for communication between the encoder chamber and an exterior, the first static pressure seal portion being provided with a first seal ring for forming a first sealing gap with an outer circumferential surface of the first shaft end portion, the first sealing gap being sealed by a sealing gas supplied from the exterior, and the second static pressure seal portion being provided with a second seal ring for forming a second sealing gap with an outer circumferential surface of the second shaft end portion, the second sealing gap being sealed by the sealing gas supplied from the exterior.

According to the present invention, the first and second seal rings are attached to the first and second shaft end portions of the rotating motor shaft, which protrudes longitudinally from the front end of the motor case and the rear end of the encoder cover. The gaps between the static motor parts and the rotating motor parts at the front end of the motor case and the rear end of the encoder cover are sealed by the first and second static pressure seal portions, which are configured by these seal rings.

The sealing gaps are sealed by the sealing gas supplied into the sealing gaps formed by the first and second seal rings, and gas flows directed into the motor chamber and into the encoder chamber from the sealing gaps are formed by some of the sealing gas supplied into the sealing gaps. This prevents foreign matter such as abrasion powder, etc. from leaking out from inside the motor chamber and inside the encoder chamber.

Sealing gas that has flowed into the motor chamber passes through the motor chamber interior and flows into the encoder chamber from the partition plate communication path. The sealing gas that has flowed into the encoder chamber is exhausted to the exterior from the exhaust port formed in the encoder cover, and is recovered at a prescribed recovery part.

Meanwhile, some of the sealing gas supplied into the sealing gaps formed by the first and second seal rings flow to the front side and rear side, respectively, along the outer circumferential surface of the first and second shaft end portions, and flow out to the exterior from the sealing gaps. The sealing gaps are sealed by the sealing gas, and a flow of sealing gas that flows out to the exterior from each sealing gap is formed; therefore, corrosive gas, liquid, etc., is prevented from infiltrating the motor chamber and the encoder chamber from the exterior.

According to the present invention, the first and second seal rings are attached to the first and second shaft end portions of the rotating motor shaft to configure first and second static pressure seal portions. In comparison with a case in which an air supply path for sealing gas is formed on the constituent members of the motor case and a static pressure seal portion is formed between the case front plate part and the outer circumferential surface of the rotating motor shaft that passes through the case front plate part, the structure for the motor constituent components will not be made any more complex, and the gap at the front end of the motor case and the gap at the rear end of the encoder cover can be reliably sealed.

Also, the sealing gas that has flowed into the motor chamber is caused to flow out to the encoder chamber via the partition plate communication path, and is exhausted to the exterior from the encoder chamber via the exhaust port formed on the encoder cover. This is more advantageous for flattening the motor than when the exhaust port is formed on the motor case.

Specifically, when sealing gas is to be directly exhausted to the exterior from the motor chamber, it is necessary to form the exhaust port on the motor case. A stator core, a drive coil, etc., which constitute the motor stator, are attached to the inner circumferential surface of the motor case. Therefore, in many cases it is not possible to ensure a space for providing the exhaust port on the motor case.

When the exhaust port is provided, the axial length of the motor case often increases, which is disadvantageous for flattening the motor.

The bearings for rotatably supporting the rotating motor shaft are respectively attached to the case front part of the motor case and the partition plate attached to the rear end of the motor case. The loss in cross section due to the exhaust port, etc., is disadvantageous for ensuring the strength and rigidity required for the motor case. The encoder cover may be less strong and rigid than the motor case, and the exhaust port is readily provided.

Here, it is possible to use the following configuration for the first and second static pressure seal portions. The first seal ring is provided with a first air supply port for sealing gas formed on an outer circumferential surface thereof, and the first sealing gap is provided with: an annular first air supply reservoir via which sealing gas is supplied from the first air supply port: an annular first inside gap, narrower than the first air supply reservoir, via which the first air supply reservoir and the inside of the motor chamber communicate; and an annular first outside gap, narrower than the first air supply reservoir, via which the first air supply reservoir and the exterior communicate.

The second seal ring is provided with a second air supply port for sealing gas, formed on an outer circumferential surface thereof, and the second sealing gap is provided with: an annular second air supply reservoir via which sealing gas is supplied from the second air supply port; an annular second inside gap, narrower than the second air supply reservoir, via which the second air supply reservoir and the inside of the encoder chamber communicate; and an annular second outside gap, narrower than the second air supply reservoir, by which the second air supply reservoir and the exterior communicate.

In the static pressure seal-equipped motor of the present invention, the bearings that support the rotating motor shaft are respectively attached to the case front plate part of the motor case and the partition plate.

In this case, it is desirable for a bypass to be formed on a bearing attachment part by which the motor side bearing at the case front plate part is attached, the bypass bypassing the motor side bearing and leading the sealing gas from the first inside gap of the first sealing gap into the motor chamber.

By forming the bypass, a smooth flow of sealing gas to inside the motor chamber is formed. Also, the sealing gas passes through the interior of the motor side bearing, and it is possible to suppress the scattering of foreign matter such as abrasion powder, etc., generated therein to inside the motor chamber.

There is almost no flowing of the sealing gas through the interior of the other encoder side bearing. Specifically, the communication path is formed on the partition plate to which the bearing is attached, and the sealing gas that passes through the communication path flows into the encoder chamber. Also, in the second static pressure seal portion, the sealing gas that flows into the encoder chamber from the second sealing gap is exhausted to the exterior via the exhaust port from the encoder chamber. Thus, no risk is presented that foreign matter such as abrasion powder, etc., generated at the encoder side bearing will scatter into the motor chamber or into the encoder chamber by the sealing gas.

In the static pressure seal-equipped motor of the present invention, the motor encoder disposed inside the encoder chamber is preferably a magnetic encoder. It is conceivable that foreign matter such as oil generated within the motor chamber will flow into the encoder chamber and adhere to the motor encoder. As long as a magnetic encoder is used, there will be no interference with the detection operation even if foreign matter such as oil, etc., adheres thereto.

It is possible to use a hollow shaft for the rotating motor shaft of the static pressure seal-equipped motor of the present invention.

MODE FOR CARRYING OUT THE INVENTION

An embodiment of the static pressure seal-equipped motor to which the present invention is applied is described below with reference to the accompanying drawings. The embodiment described hereafter is an example of when the present invention is used as the drive mechanism used for cleaning of wafers, etc. However, the static pressure seal-equipped motor of the present invention can be used for various types of drive mechanisms that require sealing between the motor installed atmosphere, and the peripheral atmosphere such as of a cleanroom, etc. in which that is enclosed.

(Overall Structure)

Figure 1:
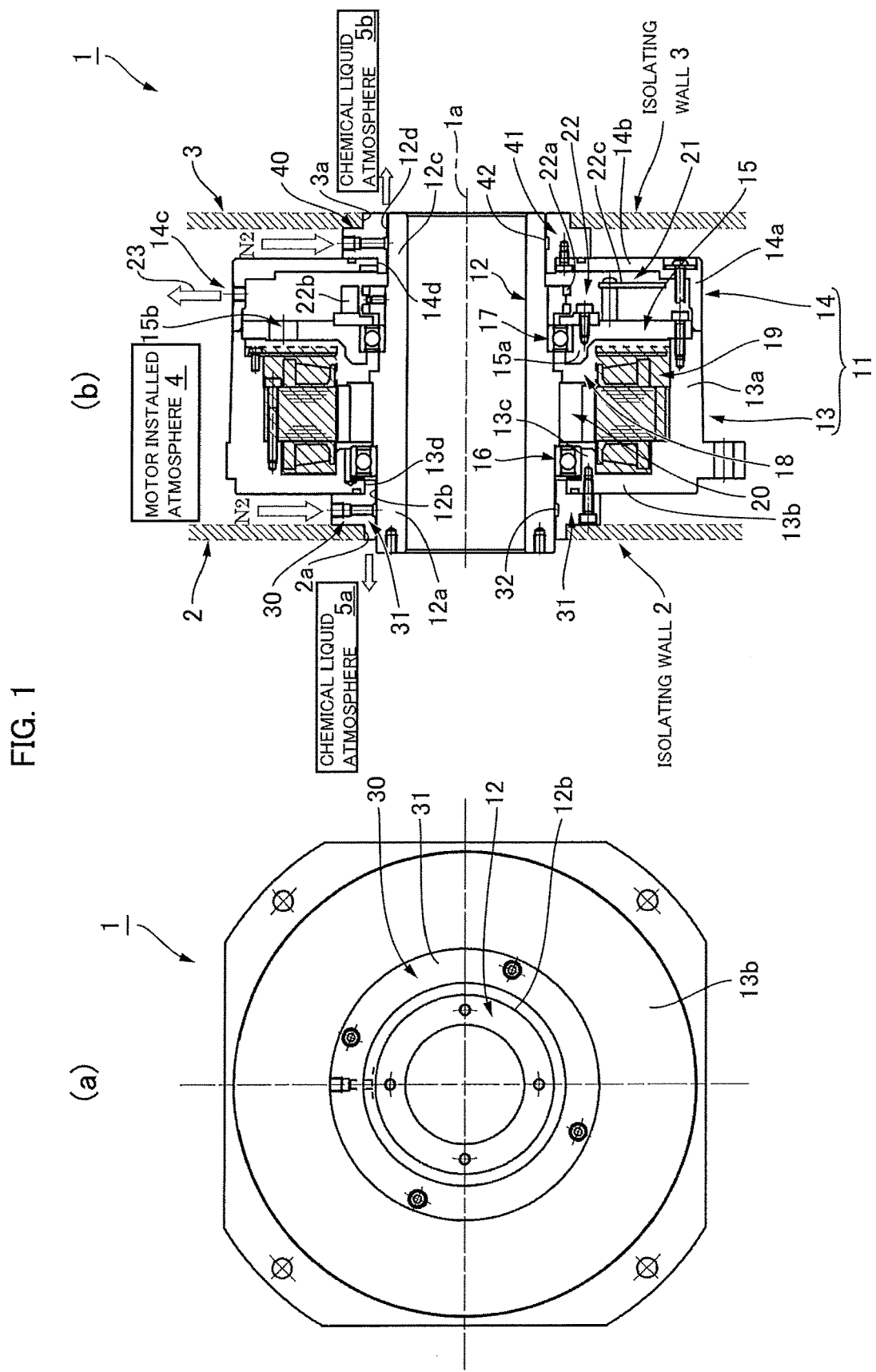
FIGS. 1(a)-1(b) include a front view and a cross sectional view of a static pressure seal-equipped motor to which the present invention is applied.

FIG. 1(a) is a front view of the static pressure seal-equipped motor of the present embodiment, and FIG. 1(b) is a cross sectional view thereof. A static pressure seal-equipped motor 1 is disposed in a state extended between a pair of isolating walls 2, 3 which are constituent components of a container of a wafer cleaning device, the space between the isolating walls 2, 3 is a motor installed atmosphere 4, and the front and rear of the isolating walls 2, 3 are chemical liquid atmospheres 5a, 5b in which a chemical for wafer cleaning is sprayed on the wafer. Once a seal has been reliably formed between the motor installed atmosphere 4 and the chemical liquid atmospheres 5a, 5b, the static-pressure-seal-equipped motor 1 is disposed between the front and rear isolating walls 2, 3.

The static pressure seal-equipped motor 1 (hereafter also referred to simply as "motor 1") is provided with a cylindrical housing 11, and a rotating motor shaft 12 comprising a hollow shaft that extends through the center part of the housing 11 in the direction of a motor axis 1a.

The housing 11 is provided with a motor case 13, and an encoder cover 14 attached coaxially to one end of the motor case 13 in the motor axis 1a direction. With the explanation hereafter, for convenience, the side of the motor case 13 in the motor axis 1a direction is called the "front side," and the side of the encoder cover 14 is called the "rear side."

The motor case 13 is provided with a cylindrical case trunk part 13a, and a round disk shaped case front plate part 13b extending radially inward from the front side end. The encoder cover 14 is provided with a cylindrical cover trunk part 14a attached coaxially to the case trunk part 13a, and a round disk shaped cover back plate part 14b extending radially inward from the rear side end. The rear end part of the case trunk part 13a is sealed off by a round disk shaped partition plate 15 that is attached coaxially to the rear end part.

The rotating motor shaft 12 is rotatably supported by a front side motor side bearing 16, and a rear side encoder side bearing 17. The motor side bearing 16 is attached to a bearing holding part 13c formed on the inner circumference side part of the case front plate part 13b. The encoder side bearing 17 is attached to a bearing holding part 15a formed on the inner circumferential surface of the partition plate 15.

The space demarcated by the motor case 13, the partition plate 15, and the rotating motor shaft 12 is a motor chamber 18, and here, a stator assembly 19 attached to the inner circumferential surface of the case trunk part 13a and a rotor assembly 20 attached to the outer circumferential surface of the rotating motor shaft 12 are incorporated.

The space demarcated by the encoder cover 14, the partition plate 15, and the rotating motor shaft 12 is an encoder chamber 21, in which a magnetic encoder 22 is incorporated to detect rotation information of the rotating motor shaft 12. A magnetic pole encoder plate 22a of the magnetic encoder 22 is attached coaxially to the rotating motor shaft 12, and a magnetic pole detector 22b and a signal converter 22c are attached to the partition plate 15.

A partition plate communication path 15b comprising a through hole is formed at a site in the radial-direction center of the partition plate 15. The motor chamber 18 and the encoder chamber 21 are in communication via the partition plate communication path 15b. An exhaust port 14c is formed on the cover trunk part 14a of the encoder cover 14. An exhaust recovery tube 23 is connected to the exhaust port 14c, and gas can be recovered at a recovery part (not shown) via the exhaust recovery tube 23.

Here, the first shaft end portion 12a of the front side of the rotating motor shaft 12 protrudes frontward from the case front plate part 13b, and furthermore, passes through the front side isolating wall 2 and penetrates to the chemical liquid atmosphere 5a side. At the outer circumference part of the first shaft end portion 12a, a front side first static pressure seal portion 30 is disposed between the case front plate part 13b and the isolating wall 2. The first static pressure seal portion 30 seals the gap between a circular inner circumferential surface 13d of the case front plate part 13b and a circular outer circumferential surface 12b of the first shaft end portion 12a, and seals the gap between a circular inner circumferential surface 2a of the isolating wall 2 and the circular outer circumferential surface 12b of the first shaft end portion 12a.

Similarly, a second shaft end portion 12c of the rear side of the rotating motor shaft 12 protrudes to the rear from the cover back plate part 14b, and furthermore, passes through the rear side isolating wall 3 and is exposed at the side of the chemical liquid atmosphere 5b. At the outer circumference part of the second shaft end portion 12c, a rear side second static pressure seal portion 40 is disposed between the cover back plate part 14b and the isolating wall 3. The second static pressure seal portion 40 seals the gap between a circular inner circumferential surface 14d of the cover back plate part 14b and a circular outer circumferential surface 12d of the second shaft end portion 12c, and also seals the gap between a circular inner circumferential surface 3a of the isolating wall 3 and the circular outer circumferential surface 12d of the second shaft end portion 12c.

The front and rear first and second static pressure seal portions 30, 40 have basically the same structure. The first static pressure seal portion 30 is provided with a first seal ring 31 coaxially enclosing the first shaft end portion 12a.

The first seal ring 31 is attached coaxially using bolts to the inner circumference edge part of the case front plate part 13b. A first sealing gap 32 that is sealed by a pure sealing gas such as nitrogen gas, etc., supplied from the exterior is formed between the inner circumferential surface of the first seal ring 31 and the circular outer circumferential surface 12b of the first shaft end portion 12a.

Similarly, the second static pressure seal portion 40 is provided with a second seal ring 41 that coaxially encloses the second shaft end portion 12c. The second seal ring 41 is bolted to the inner circumference edge part of the cover back plate part 14b. A second sealing gap 42 that is sealed by a pure sealing gas such as nitrogen gas, etc., supplied from the exterior is formed between the inner circumferential surface of the second seal ring 41 and the circular outer circumferential surface 12d of the second shaft end portion 12c.

(First and Second Static Pressure Seal Portions)

Figure 2:
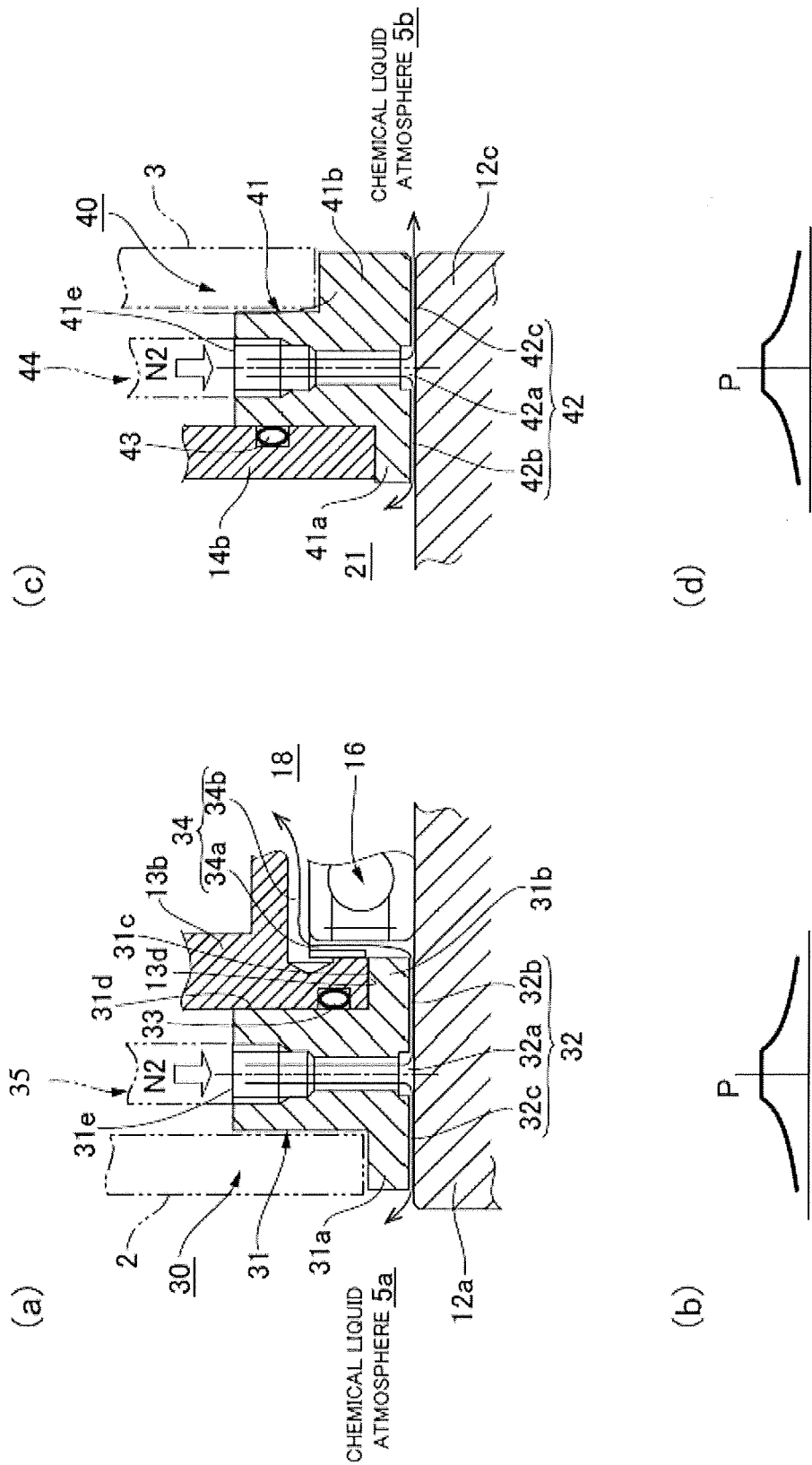
FIGS. 2(a)-2(d) include an enlarged view showing the front side static pressure seal portion and a pressure distribution chart of the sealing gap, and an enlarged view showing the rear side static pressure seal portion and a pressure distribution chart of the sealing gap.

FIGS. 2(a) and (b) are respectively an enlarged view of the front side first static pressure seal portion 30, and a pressure distribution chart of the first sealing gap 32. FIGS. 2(c) and (d) are respectively an enlarged view of the rear side second static pressure seal portion 40, and a pressure distribution chart of the second sealing gap 42.

Explaining with reference to FIG. 2(a), the first seal ring 31 of the first static pressure seal portion 30 has the inner circumference side part protruding in a symmetrical state to the front and rear, thus forming a front side flange part 31a and a rear side flange part 31b. The front side flange part 31a side is affixed to the inner circumference edge part of the front side isolating wall 2. The circular outer circumferential surface 31c and a rear side end surface 31d of the rear side flange part 31b are adhered to the inner circumference edge part of the case front plate part 13b, and an O-ring 33 provides the seal therebetween.

A first air supply port 31e for supplying sealing gas from the exterior to the first sealing gap 32 is opened on the circular outer circumferential surface of the first seal ring 31. An air supply tube 35 is connected to the first air supply port 31e, and the air supply tube 35 is linked to a sealing gas supply source (not shown).

The first sealing gap 32 formed between the first seal ring 31 and the first shaft end portion 12a is provided with: an annular first air supply reservoir 32a for which sealing gas is supplied from the first air supply port 31e; an annular first inside gap 32b for communication between the first air supply reservoir 32a and inside the motor chamber 18; and an annular first outside gap 32c for communication between the first air supply reservoir 32a and the outside (chemical liquid atmosphere 5a). Compared to the first air supply reservoir 32a, for the first inside gap 32b and the first outside gap 32c at both sides thereof, the radial direction space is narrower.

Here, grooves (radial direction groove 34a and axial-direction groove 34b) acting as the sealing gas bypass 34 are formed in the bearing holding part 13c of the case front plate part 13b to which the first seal ring 31 is attached, the grooves being formed between the bearing holding part 13c and the motor side bearing 16. The sealing gas bypass 34 provides communication between the first inside gap 32b of the first sealing gap 32 and the internal space of the motor chamber 18.

Next, as seen in FIG. 2(c), in the other second seal ring 41 of the second static pressure seal portion 40, the inner circumference side part thereof protrudes to the front and rear, and a front side flange part 41a and a rear side flange part 41b are formed. The front side flange part 41a is affixed to the inner circumference edge part of the cover back plate part 14b, and an O-ring 43 creates a seal therebetween. The rear side flange part 41b is affixed to the inner circumference edge part of the rear side isolating wall 3.

A second air supply port 41e for supplying sealing gas to the second sealing gap 42 from the exterior is opened on the circular outer circumferential surface of the second seal ring 41. An air supply tube 44 is connected to the second air supply port 41e, and the air supply tube 44 is linked to a sealing gas supply source (not shown).

The second sealing gap 42 formed between the second seal ring 41 and the second shaft end portion 12c is provided with: an annular second air supply reservoir 42a via which sealing gas is supplied from the second air supply port 41e; an annular second inside gap 42b for communication between the second air supply reservoir 42a and inside the encoder chamber; and an annular second outside gap 42c for communication between the second air supply reservoir 42a and the exterior (chemical liquid atmosphere 5b). The second inside gap 42b and the second outside gap 42c on both sides of the second air supply reservoir 42a have a narrower radial direction space than the second air supply reservoir 42a.

(Description of Operation)

With the motor 1 of this configuration, pure sealing gas such as nitrogen gas ($N_2$) is introduced into the first and second sealing gaps 32, 42 from the air supply ports 31e, 41e of the first and second static pressure seal portions 30, 40. The sealing gas introduced to the first sealing gap 32 is diverged into to the chemical liquid atmosphere 5a and the motor chamber 18 by the first air supply reservoir 32a. The static pressure distribution of the sealing gas supplied to the first sealing gap 32 along the direction of the motor axis 1a in the sealing gap 32 is in the state shown in FIG. 2(b). Specifically, the pressure is highest at the first air supply reservoir 32a part, and gradually decreases along the motor axis 1a toward the first inside gap 32b and the first outside gap 32c side.

The sealing gas that flows into the inside of the motor chamber 18 from the first sealing gap 32 of the front side first static pressure seal portion 30 bypasses the motor side bearing 16, and flows into the motor chamber 18 through the sealing gas bypass 34. The sealing gas that has flowed into the inside of the motor chamber 18 flows to the encoder chamber 21 through the partition plate communication path 15b formed on the partition plate 15, and is exhausted from the exhaust port 14c formed on the encoder cover 14.

The sealing gas introduced to the second sealing gap 42 of the rear side second static pressure seal portion 40 is diverged into the chemical liquid atmosphere 5b and the encoder chamber 21 by the second air supply reservoir 42a. The static pressure distribution of the sealing gas in this case assumes the state shown in FIG. 2(d). The sealing gas that has flowed into the encoder chamber 21 is exhausted from the exhaust port 14c formed on the encoder cover 14.

Keeping the internal pressure of the first and second air supply reservoirs 32, 42 higher than the internal pressure of the chemical liquid atmospheres 5a, 5b and the internal pressure of the motor chamber 18 or the encoder chamber 21 makes it possible to prevent a gas containing a chemical liquid from infiltrating the motor chamber 18 or the encoder chamber 21. It is also possible to prevent dust in the motor chamber 18 or the encoder chamber 21 from flowing out to the chemical liquid atmospheres 5a, 5b.

The invention claimed is:

1. A static pressure seal-equipped motor comprising:
a motor case;
an encoder cover attached to a rear end of the motor case;

a partition plate that partitions between a motor chamber formed inside the motor case, and an encoder chamber formed inside the encoder cover;

a rotating motor shaft that penetrates and extends through a case front plate part of the motor case, the partition plate, and a cover back plate part of the encoder cover;

a first static pressure seal portion that seals off a gap between the case front plate part, and a first shaft end portion of the rotating motor shaft protruding to a front from the case front plate part;

a second static pressure seal portion that seals off a gap between the cover back plate part, and a second shaft end portion of the rotating motor shaft protruding to a rear from the cover back plate part;

a partition plate communication path formed in the partition plate for communication between the motor chamber and the encoder chamber; and an exhaust port formed in the encoder cover for communication between the encoder chamber and an exterior, the first static pressure seal portion being provided with a first seal ring for forming a first sealing gap with an outer circumferential surface of the first shaft end portion, the first sealing gap defining a first flow path of a sealing gas supplied from the exterior so that the sealing gas diverges through the first sealing gap and flows to the motor chamber and an outside of the motor chamber, and the second static pressure seal portion being provided with a second seal ring for forming a second sealing gap with an outer circumferential surface of the second shaft end portion, the second sealing gap defining a second flow path of the sealing gas supplied from the exterior so that the sealing gas diverges through the second gap and flows to the encoder chamber and an outside of the encoder chamber.

2. The static pressure seal-equipped motor according to claim 1, wherein the first seal ring is provided with a first air supply port for sealing gas formed on an outer circumferential surface thereof, and the first sealing gap is provided with: an annular first air supply reservoir via which the sealing gas is supplied from the first air supply port: an annular first inside gap, narrower than the first air supply reservoir, via which the first air supply reservoir and the inside of the motor chamber communicate; and an annular first outside gap, narrower than the first air supply reservoir, via which the first air supply reservoir and the exterior communicate, and wherein the second seal ring is provided with a second air supply port for sealing gas, formed on an outer circumferential surface thereof, and the second sealing gap is provided with: an annular second air supply reservoir via which the sealing gas is supplied from the second air supply port; an annular second inside gap, narrower than the second air supply reservoir, via which the second air supply reservoir and the inside of the encoder chamber communicate; and an annular second outside gap, narrower than the second air supply reservoir, by which the second air supply reservoir and the exterior communicate.

3. The static pressure seal-equipped motor according to claim 2, further comprising:

a motor side bearing that supports the rotating motor shaft, the motor side bearing being attached to the case front plate part of the motor case inside the motor chamber; and an encoder side bearing that supports the rotating motor shaft, the encoder side bearing being attached to the partition plate.

4. The static pressure seal-equipped motor according to claim 3, further comprising:

a bypass formed on a bearing attachment part of the case front plate part where the motor side bearing is attached, the bypass bypassing the motor side bearing and leading the sealing gas from the first inside gap of the first sealing gap into the motor chamber.

5. The static pressure seal-equipped motor according to claim 1, wherein the motor encoder disposed inside the encoder chamber is a magnetic encoder.

6. The static pressure seal-equipped motor according to claim 1, wherein the rotation motor shaft is a hollow shaft.

* * * * *